United States Patent [19]

Stelling et al.

[11] Patent Number: 5,003,195

[45] Date of Patent: Mar. 26, 1991

[54] PIN DIODE ATTENUATOR RF PULSE GENERATOR WITH PULSE RISE AND FALL TIME CONTROL

[75] Inventors: Desi Stelling, Phoenix; Robert J. Aleksa; Nicholas J. Wilt, both of Glendale, all of Ariz.

[73] Assignee: Honeywell Inc., Minneapolis, Minn.

[21] Appl. No.: 322,489

[22] Filed: Mar. 10, 1989

[51] Int. Cl.[5] .......................... H03K 5/01; H03K 5/08
[52] U.S. Cl. ..................... 307/268; 307/263; 307/555; 307/565; 333/81 R
[58] Field of Search ............... 307/228, 263, 268, 542, 307/561, 565, 555; 333/81 R

[56] References Cited

U.S. PATENT DOCUMENTS

| | | | |
|---|---|---|---|
| 3,402,353 | 9/1968 | Hubbs | 307/263 |
| 3,813,561 | 5/1974 | Williams et al. | 307/263 |
| 3,922,570 | 11/1975 | Eguchi et al. | 307/565 |
| 4,488,062 | 12/1984 | Welzhofer | 307/263 |
| 4,800,294 | 1/1989 | Taylor | 307/263 |

*Primary Examiner*—John Zazworsky
*Attorney, Agent, or Firm*—Seymour Levine; Albin Medved; Roger W. Jensen

[57] ABSTRACT

A capacitor is charged and discharged through switch selectable resistors from regulated DC voltage supplies and clamping diodes to provide the bias signal to control the rise and fall times of the RF output pulse of a PIN diode attenuator. An isolation buffer isolates charging and discharging transients from the bias signal. An adjustable AC gain and adjustable DC offset inverting amplifier provides the isolation buffered signal to a high impedance, very low output AC impedance source for driving the bias input of the PIN diode attenuator. The DC offset is provided by an adjustable regulated voltage source coupled to the inverting amplifier.

7 Claims, 7 Drawing Sheets

PIN DIODE ATTENUATOR RF PULSE GENERATOR WITH PULSE RISE AND FALL TIME CONTROL

BACKGROUND OF THE INVENTION

1. Field of the Invention

The invention relates to radio frequency (RF) pulse modulation, particularly with respect to utilization of an RF PIN diode attenuator pulse generator.

2. Description of the Prior Art

The RF PIN diode attenuator is known in the prior art for generating a pulse modulated RF carrier for use, for example, in testing the characteristics of radio frequency receivers. Such attenuators utilize the P-Intrinsic-N type diode (PIN diode). Such prior art devices generate an RF pulse by applying an RF carrier to the RF input port of the attenuator and applying a bias signal to the PIN diode to control the attenuator from maximum to minimum to maximum attenuation thereby generating an RF pulse at the output port of the device. Such prior art RF pulse generators do not control the shape of the modulated pulse. Additionally, the techniques utilized in the prior art introduce transients into the modulated signal. Generation of such transients are normally associated with the control of pulse transitions. The shortcomings of the prior art RF PIN diode attenuator pulse generators are principally caused by the inability to control the PIN diode to attenuate the RF signals accurately and reliably because of the sharp knee on the PIN diode characteristic curve. A small change in bias current results in a large change in attenuation.

In order to evaluate the design of radio frequency receivers, a means to control the pulse shape of the modulated test signal is required. The required control should independently modify the transition times of the rising and falling edges of the envelope of the modulated RF pulse while minimizing the delay to the signal. In a specific application, the rise and fall transition times should be independently adjustable between 50 and 600 nanoseconds while the total propagation delay is held to less than 25 nanoseconds. Specifically, an RF source in the range of 1 GHz is utilized.

The non-variable pulse modulation in the prior art does not permit a controlled evaluation of the characterisics of RF receivers. Additionally, the transients induced into the modulated signal by the prior art techniques further complicate such evaluation.

SUMMARY OF THE INVENTION

The present invention provides precise and accurate control of the rise and fall times of the output pulse of an RF PIN diode attenuator over 100% of the controlled attenuation range thereof. A capacitor is charged and discharged through switched resistors from positive and negative clamped voltage levels established by regulated voltage sources and clamping diodes. The charging and discharging voltage waveforms provide the adjustable and precisely controlled rising and falling edges of the RF modulation. The charging and discharging waveforms are applied through an isolation buffer to an adjustable AC gain controlling amplifier with a DC offset adjustment control. The isolation buffer isolates any impedance effects to the charging and discharging circuit by providing a constant load impedance to charge and discharge the capacitor. The AC gain control of the gain controlling and offset adjusting amplifier establishes the attenuation range over which the RF pulse is generated. The DC offset adjustment of the gain controlling and offset adjusting amplifier establishes the operating point on the PIN diode characteristic. The output of the gain controlling and offset adjusting amplifier is applied to a low impedance output driving buffer for applying the bias control to the PIN diode attenuator. The output buffer maintains a low AC source impedance which provides maximum control speed of the PIN diode being modulated.

DESCRIPTION OF THE PREFERRED EMBODIMENT

Figure 1:
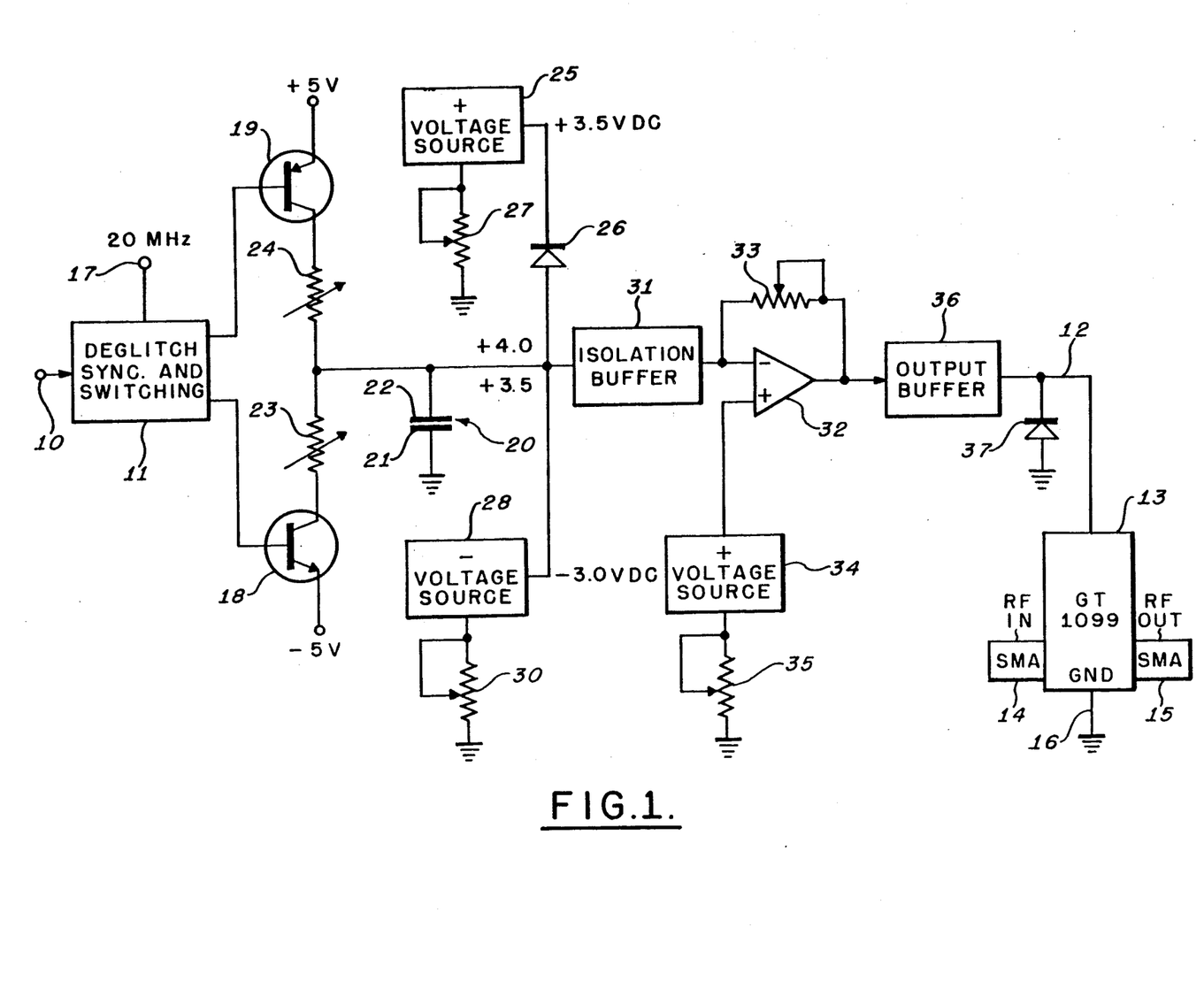
FIG. 1 is a schematic block diagram of a PIN diode attenuator RF pulse generator implemented in accordance with the present invention.
Figure 2:
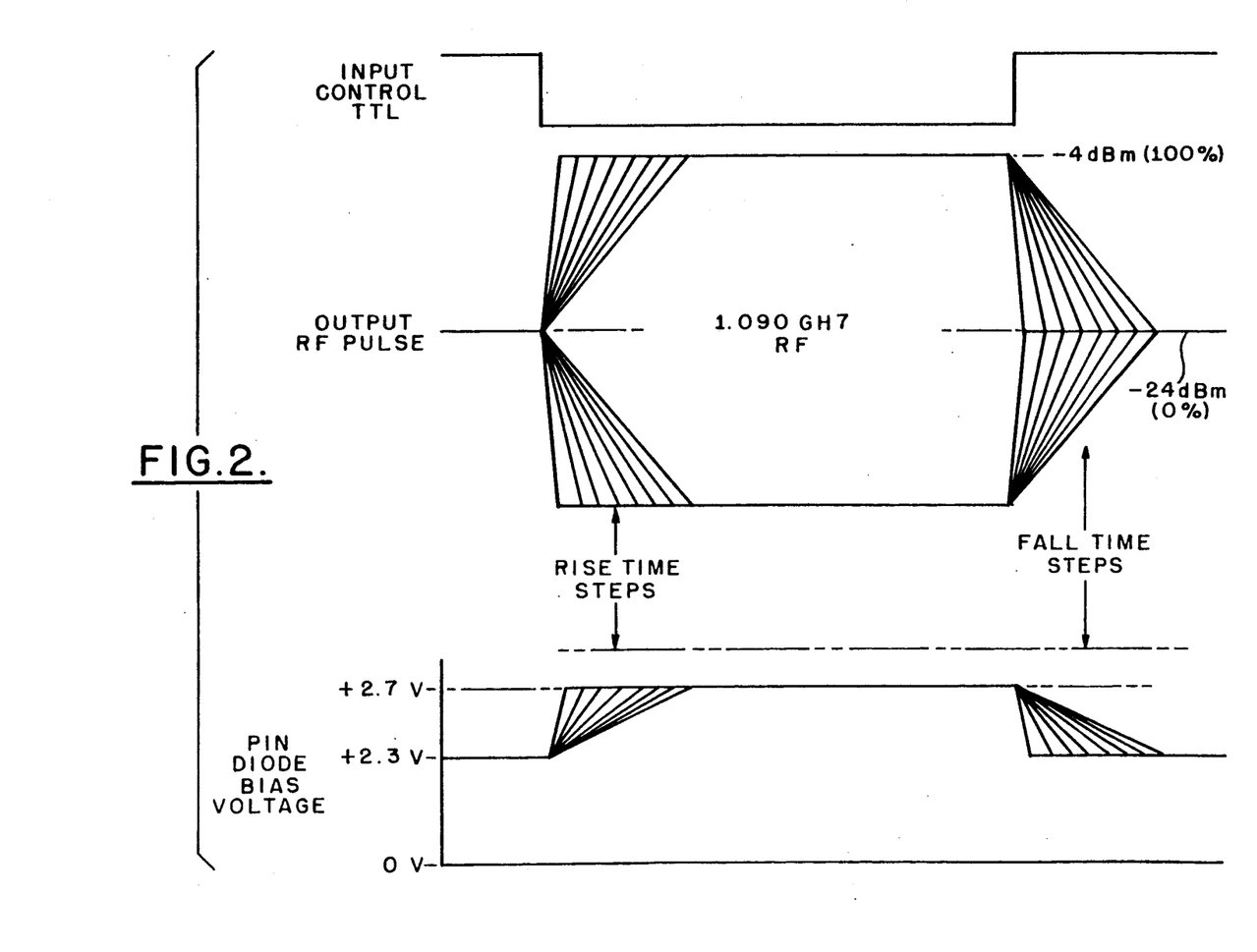
FIG. 2 is a waveform diagram illustrating primary input and output waveforms of the apparatus of FIG. 1.

Referring to FIGS. 1 and 2, an input control pulse provided at digital TTL levels and illustrated in FIG. 2 is applied at a terminal 10 to a deglitch, synchronizing and switching section 11. The input TTL pulse is active in the low state thereof. In response to the control pulse at the terminal 10, the apparatus of FIG. 1 provides precise PIN diode bias voltages on a line 12 to the bias input of a PIN diode RF attenuator 13. The attenuator 13 has an RF input port 14 for applying the RF input carrier to the attenuator 13. The attenuator 13 has an RF output port 15 for providing the output RF pulse. The PIN diode attenuator 13 is returned to ground potential through a line 16. The apparatus of FIG. 1 provides, in a manner to be described, complete and accurate control of an RF source applied to the port 14. The source may, for example, provide 1.030 GHz or 1.090 GHz. The circuitry of FIG. 1 independently provides rise and fall time control in twelve equal steps of 50 nanoseconds each (50 to 600 nanoseconds). The RF envelope provided at the output port 15 does not exceed the 100% amplitude level thereby exhibiting no overshoot. The minimum to maximum attenuation is adjustable between 0 and 50 dB. FIG. 2 depicts the PIN diode bias voltage applied at the line 12 for controlling the illustrated rise time and fall time steps. FIG. 2 also illustrates the output RF pulse with the independently controlled rise time steps and fall time steps. The PIN diode bias voltage varies between +2.3 volts and +2.7 volts. The +2.3 volt level controls the maximum attenuation of the attenuator 13. In the preferred embodiment, the attenuation level representing approximately 0% modulation is at −24 dBm. The +2.7 volt PIN diode bias voltage level controls the minimum attenuation of −4 dBm which provides the maximum modulation of approximately 100%. In the illustrated waveforms of FIG. 2, an RF carrier is modulated by the attenuator 13 in a plurality of independently controlled rise time and fall time steps. Thus, in a manner to be described, the apparatus of FIG. 1 provides precise RF attenuation and pulsed RF envelope control. The attenuator 13 may be implemented by the commercially procurable GT1099 PIN diode RF attenuator or equivalent device.

With continued reference to FIG. 1, the circuit 11 deglitches the input TTL control pulse applied at the terminal 10 and synchronizes the switching of the RF pulse with a system 20 MHz clock applied at a terminal 17. The circuit 11 provides switching control signals to the bases of transistors 18 and 19. The transistor 18 is of the NPN type with the emitter thereof coupled to a −5 volt supply. The transistor 19 is of the PNP type with the emitter thereof coupled to a +5 volt supply. In response to the falling edges of the input TTL pulse applied to the terminal 10, the circuit 11 turns the transistor 18 on and the transistor 19 off. In a manner to be explained, this action generates the rising edges of the RF pulse. During the duration of the RF pulse, the transistor 18 is maintained on and the transistor 19 is maintained off. In response to the rising edges of the input TTL pulse applied to the terminal 10, the circuit 11 turns the transistor 18 off and the transistor 19 on. This action generates the falling edges of the RF pulse. Between the generation of RF pulses, the circuit 11 maintains the transistor 19 on and the transistor 18 off.

The apparatus of FIG. 1 includes a capacitor 20 with capacitor plates 21 and 22. The capacitor plate 21 is connected to ground potential. In a manner to be described with respect to FIG. 6A, the capacitor 20 comprises an adjustable trim capacitor.

The collector of the transistor 18 is connected through adjustable resistor means 23 to the capacitor plate 22 and the collector of the transistor 19 is connected to the capacitor plate 22 through adjustable resistor means 24. In a manner to be described with respect to FIG. 6A, the adjustable resistor means 23 and 24 each comprises a plurality of resistors switched between the collector of the respective transistor 18 or 19 and the capacitor plate 22 to effect the rise time and fall time steps of the RF output pulse. A regulated voltage source 25 provides a regulated +3.5 volts DC to the capacitor plate 22 through a positive clamping diode 26. The clamping diode 26 has a voltage drop of 0.5 volts. Thus, the capacitor plate 22 is clamped to a maximum positive DC voltage of +4.0 volts DC. An adjustment potentiometer 27 is included for adjusting the positive voltage level clamp. A regulated voltage source 28 provides a regulated DC voltage of −3.0 volts DC through a negative clamping diode 29 to the capacitor plate 22. The clamping diode 29 has a voltage drop of 0.5 volts. Thus, the capacitor plate 22 is clamped to a maximum negative voltage level of −3.5 volts DC. An adjustment potentiometer 30 is included to adjust the negative clamping level.

At 0% modulation between the generation of pulses, the transistor 19 is on and the transistor 18 is off. The clamping diode 26 is forward-biased into conduction and the clamping diode 29 is reverse-biased by the +5 volt emitter supply of the transistor 19. Thus, the capacitor plate 22 is clamped to +4 volts DC. In order to generate the rising edge of the RF pulse, the circuit 11 turns the transistor 18 on and the transistor 19 off. The −5 volt emitter supply of the on transistor 18 reverse biases the clamping diode 26 and forward-biases the clamping diode 29. The capacitor 20 discharges from the +4 DC level to the clamped −3.5 volt DC level through the adjustable resistance means 23. The selected resistance value of the resistance means 23 determines the speed of the RC discharge thus controlling the rise time of the RF output pulse. During the generation of the RF output pulse, the capacitor plate 22 is maintained clamped at the −3.5 VDC level.

In order to generate the falling edge of the pulse, the circuit 11 turns on the transistor 19 and turns off the transistor 18. The capacitor 20 then charges from the −3.5 volt clamped DC level to the +4.0 clamped DC level through the selected resistance value of the adjustable resistance means 24. In this manner, the RC charging of the capacitor 20 determines the speed of the fall time of the RF output pulse. Thus, it is appreciated, that because of the independent adjustment of the resistance means 23 and 24, the rise and fall times of the RF output pulse are independently adjustable.

The waveform on the capacitor plate 22 clamped between +4.0 VDC and −3.5 VDC is applied through an isolation buffer 31 to an input of an inverter amplifier 32.

The inverter amplifier 32 has an AC gain of less than unity which is adjustable by adjustment potentiometer 33. The output of the amplifier 32 is offset by +2.3 volts DC from a regulated voltage source 34. The DC offset is adjustable via an adjustment potentiometer 35. The adjustable AC gain of the inverter amplifier 32 controls the amplitude of the bias signal on the line 12 thus controlling the depth of modulation of the RF output pulse. The adjustable DC offset provided by the voltage source 34 controls the region of the PIN diode characteristic curve over which the attenuation is controlled.

The output of the inverter amplifier 32 is applied to an output buffer 36 that drives the PIN diode via the bias signal on the line 12. The output buffer 36 provides a low output source impedance to the PIN diode. A protection diode 37 is connected between the line 12 and ground to protect the PIN diode against reverse voltages.

Figure 3:
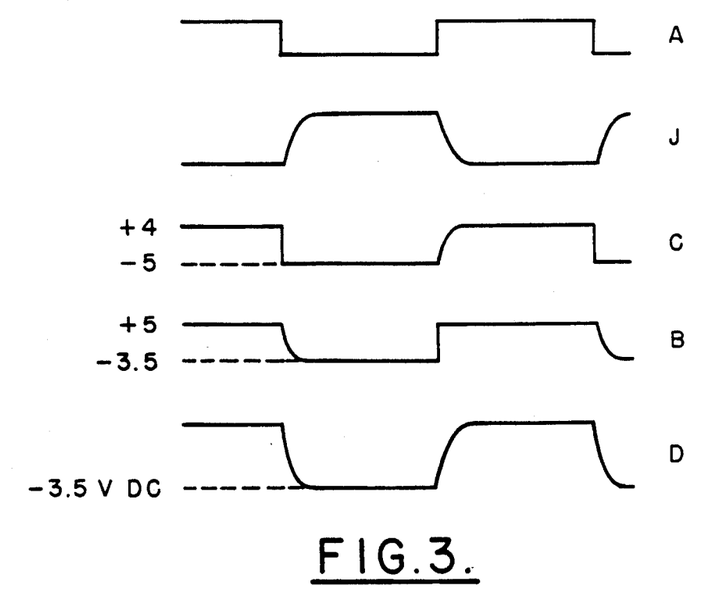
FIG. 3 is a waveform diagram illustrating waveforms appearing at various points in the apparatus of FIG. 1 useful in explaining the operation thereof.

Referring to FIG. 3 with continued reference to FIG. 1, waveforms appearing at various points of the circuit of FIG. 1 are illustrated. Waveform A is the input TTL control pulse applied to terminal 10. The low level of the pulse of waveform A is active. Waveform B appears at the collector of the transistor 19 and waveform C appears at the collector of the transistor 18. Waveform D appears at the capacitor plate 22. Waveform J is the bias voltage on the line 12 applied to the PIN diode.

With respect to waveform B, when the transistors 18 and 19 are switched such that transistor 19 switches from on to off and transistor 18 switches from off to on, the capacitor 20 discharges through resistor means 23 from +4 volts to −3.5 volts with a transition speed in accordance with the selected resistor of the resistor mean 23. When the transistors 18 and 19 are again switched such that transistor 18 switches from on to off and transistor 19 switches from off to on, the collector of the transistor 19 (waveform B) is pulled from −3.5 volts to the emitter supply of the transistor 19 of +5 volts. With respect to waveform C, when the transistor 18 switches from off to on and the transistor 19 switches from on to off, the collector of the transistor 18 is pulled from +4 volts to the transistor 18 emitter supply of −5 volts. When the transistors are switched such that transistor 18 is switched off while the transistor 19 is switched on, the capacitor 20 is charged through the selected resistor of the resistor means 24 from −3.5 volts to +4 v volts with a transition speed in accordance with the selected resistor. The waveform D is the voltage across the capacitor 20 varying between +4 VDC and −3.5 VDC with the positive and negative clamps set at +3.5 VDC and −3.0 VDC, respectively. The waveform D is inverted, scaled and offset by the inverter amplifier 32 to be provided on line 12 as waveform J.

Figure 4:
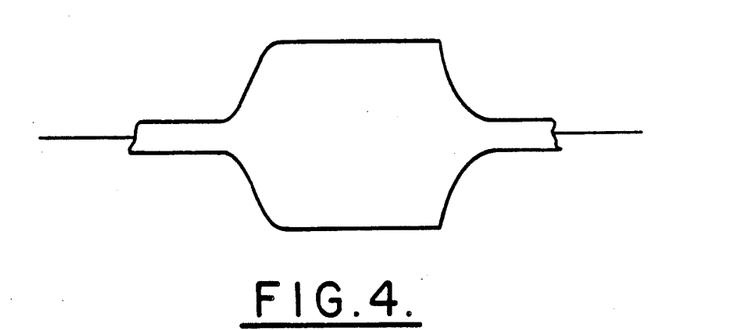
FIG. 4 is a diagram of an oscilloscopic representation of the RF output pulse of the apparatus of FIG. 1 with minimum rise and fall times.
Figure 5:
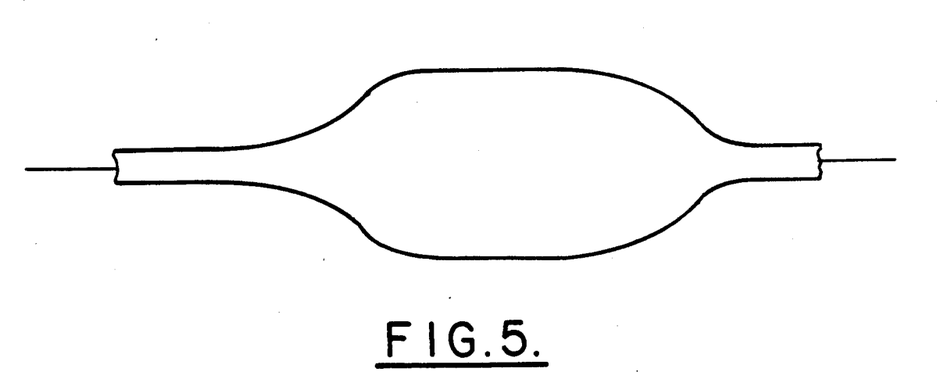
FIG. 5 is a diagram of an oscilloscopic representation of the RF output pulse of the apparatus of FIG. 1 with maximum rise and fall times.

FIGS. 4 and 5 are oscillographic repesentations of the RF output pulse provided at the output port 15 of the PIN diode attenuator 13 with minimum rise and fall times of 50 nanoseconds and maximum rise and fall times of 600 nanoseconds, respectively.

Figure 6A:
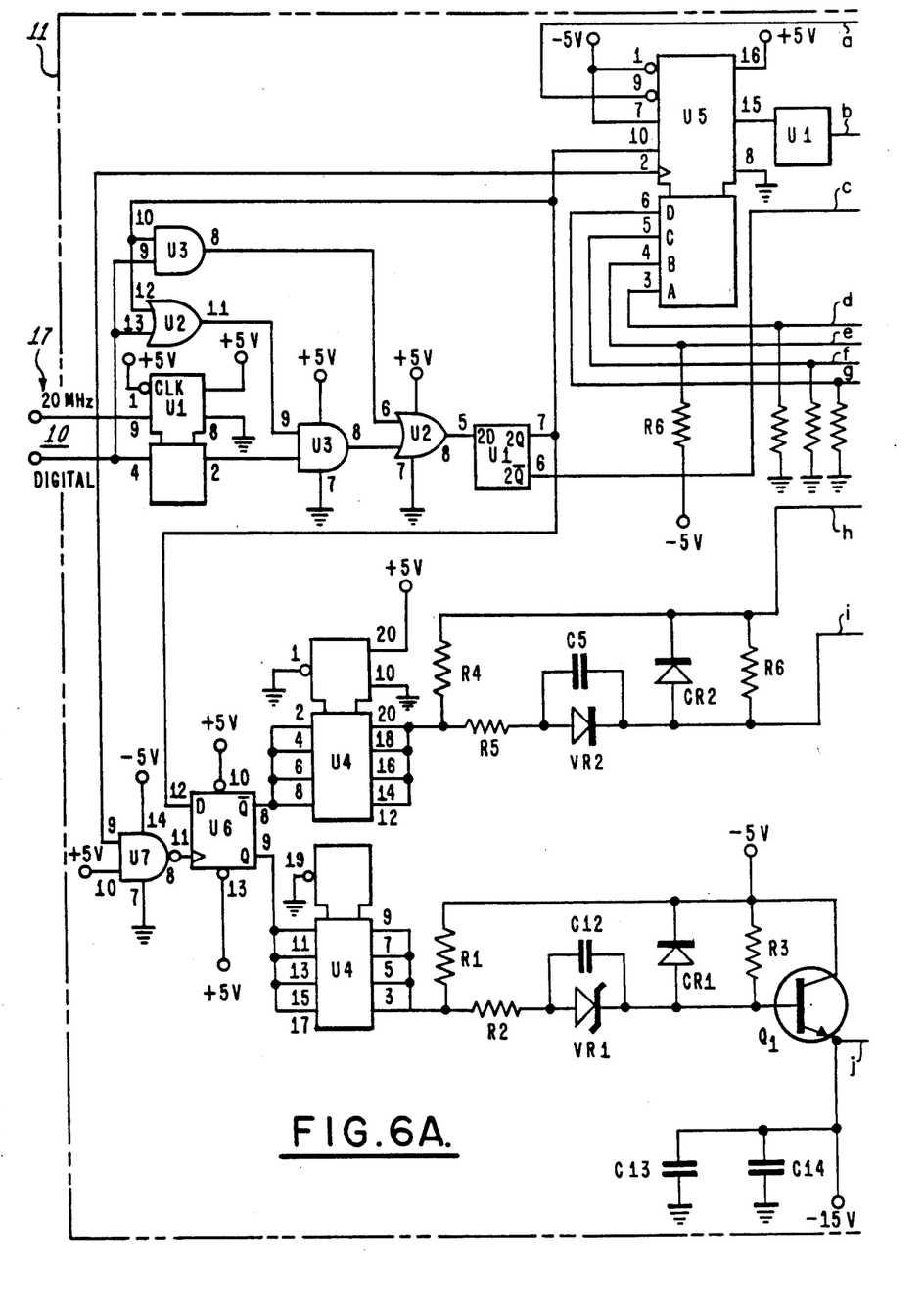
FIGS. 6A and 6B provide a detailed schematic diagram of the apparatus of FIG. 1.
Figure 6B:
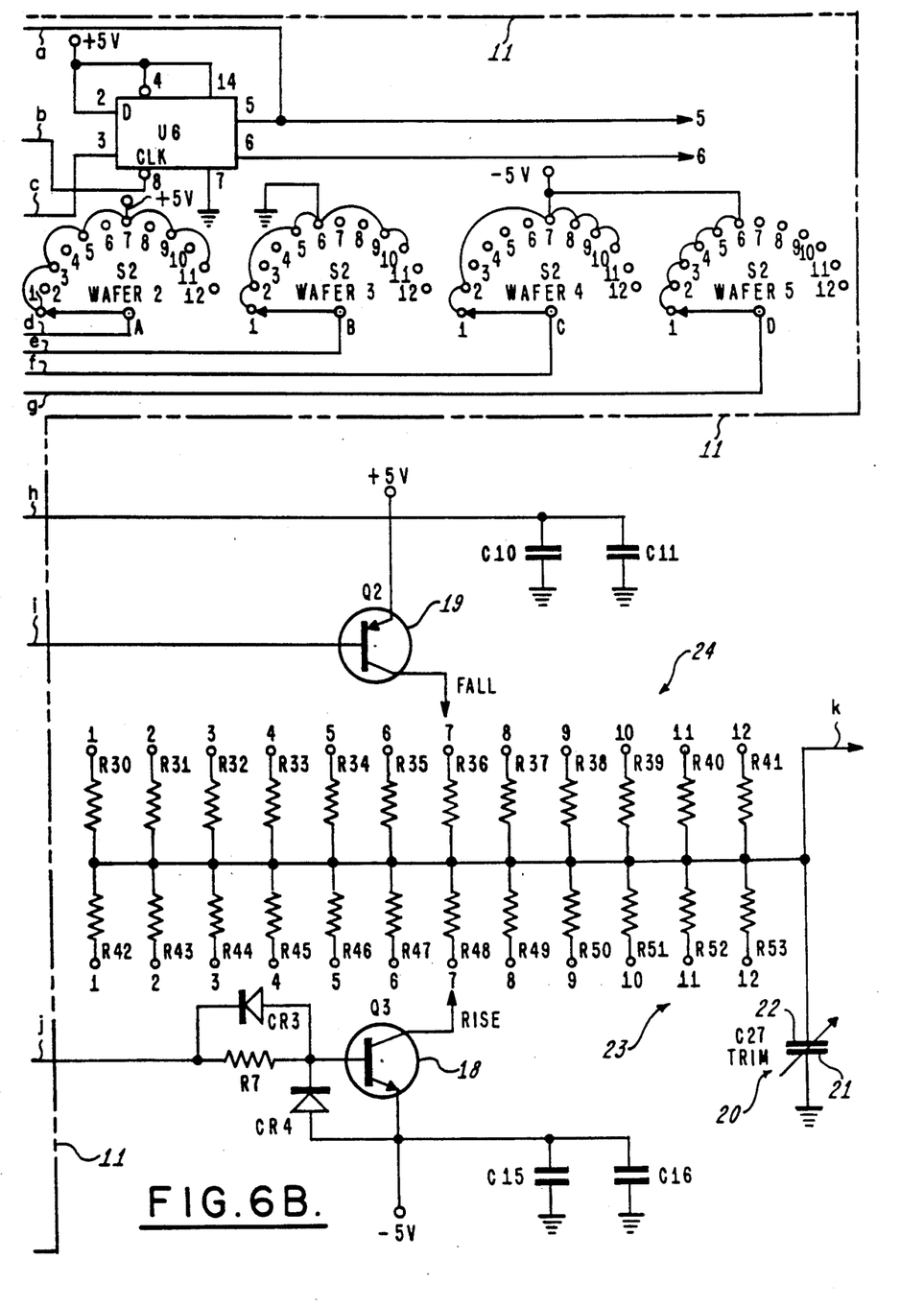
Figure 6C:
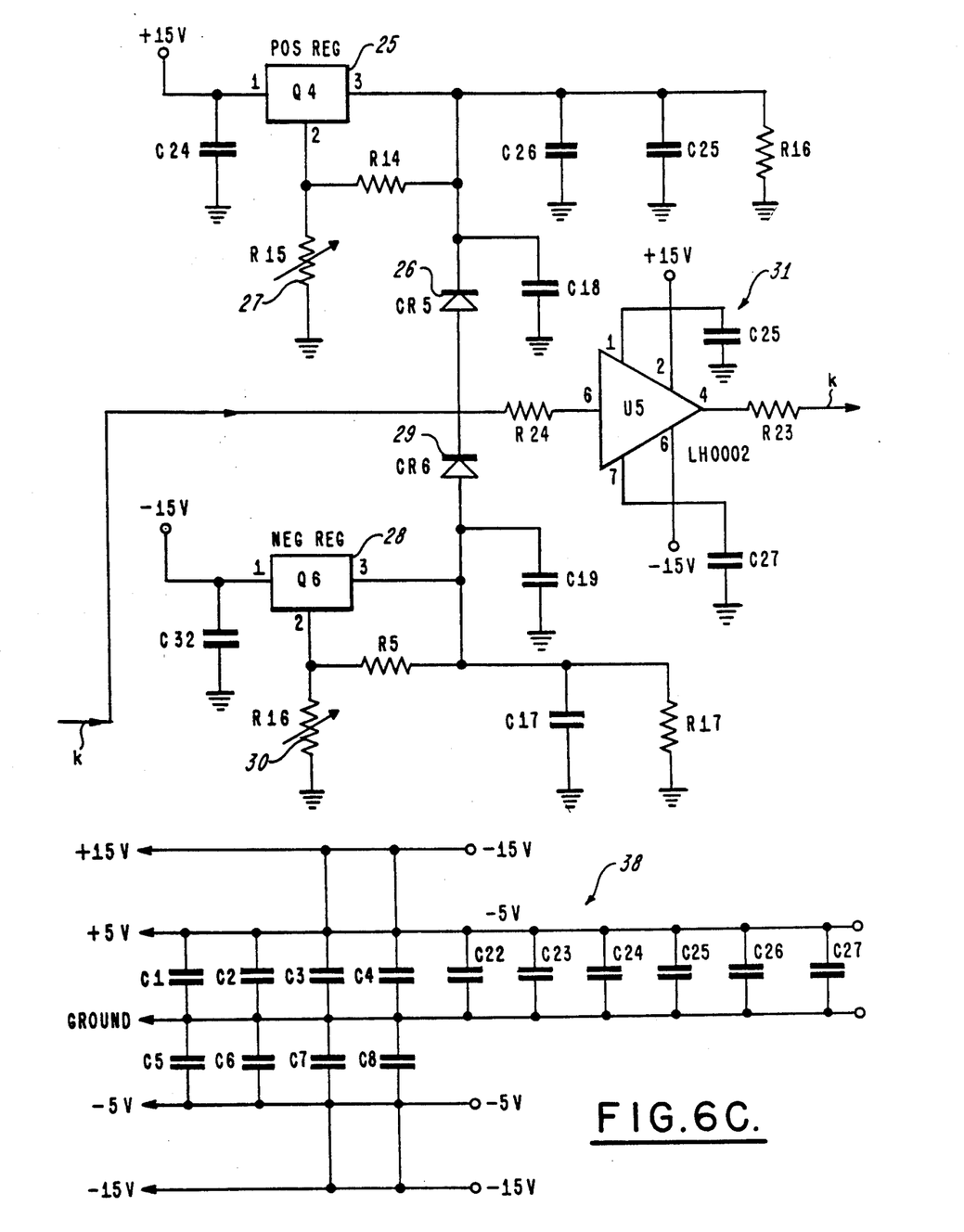
Figure 6D:
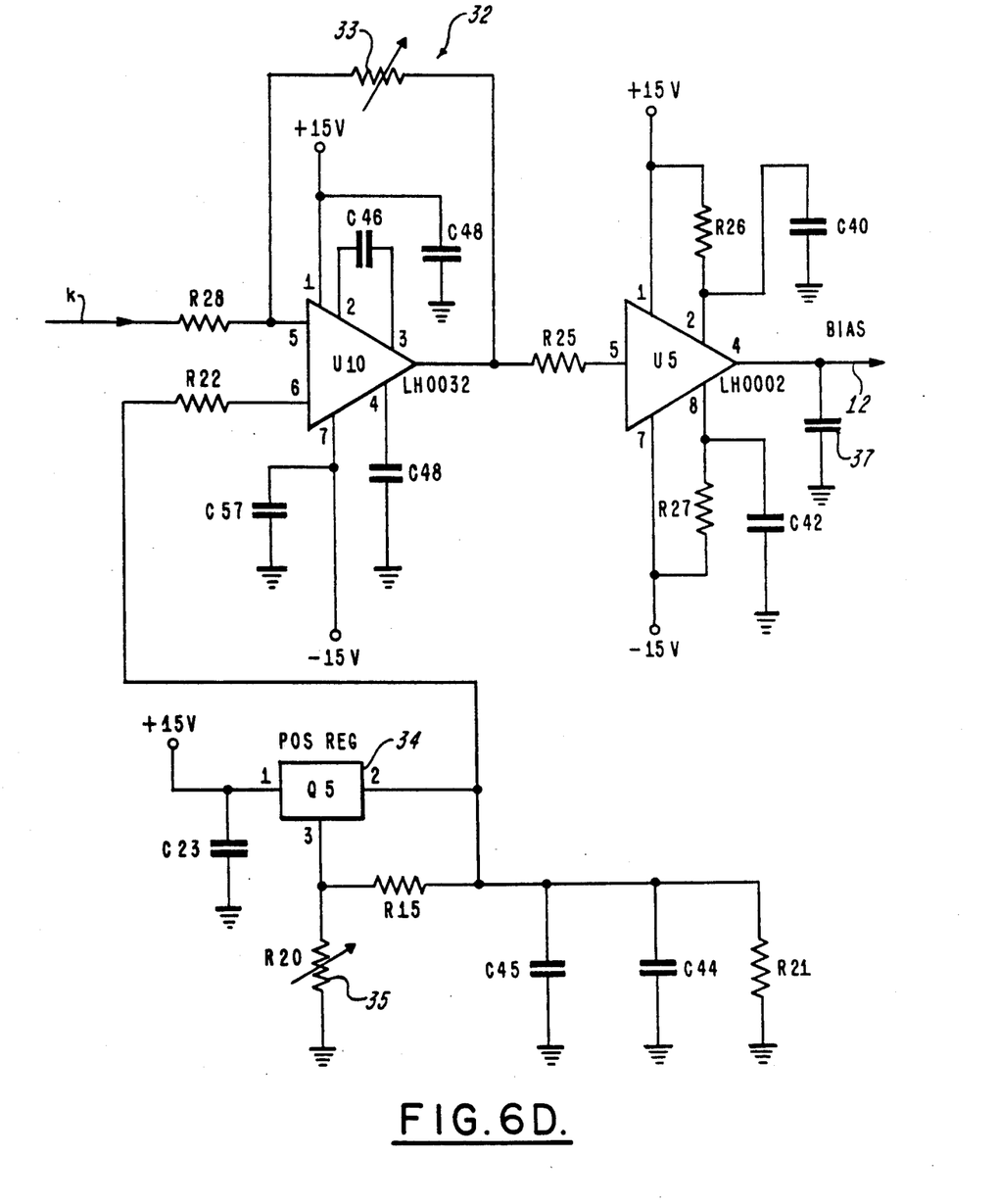

Referring to FIGS. 6A and 6B, in which like reference numerals represent like components with respect to FIG. 1, a detailed schematic diagram of the apparatus of FIG. 1 is illustrated. The detailed schematic diagram of FIG. 6A provides all of the circuitry required to charge and discharge C27 (capacitor 20) under control of the TTL signal applied at the terminal 10. Propagation time through the circuit of FIG. 6A is approximately 25 nanoseconds. The integrated circuits U1, U2 and U3 are utilized to deglitch the incoming digital video signal applied at the terminal 10 and synchronize it with the 20 MHz system clock. The counter U5 and wafers 2-5 of switch S2 provide digital delay to disable attenuation after output pulse fall time has been achieved. Thus, U5 is a binary counter which is preset to a value related to the fall time selected on wafer 1 of switch S2. The counter U5 is preset by the wafers 2, 3, 4 and 5 of switch S2. The circuitry of U1, U5, U6, etc. enables the fall time to be extended by an amount of 50 ns greater than the fall time chosen by switch S2, wafer 1 and enables full control of the RF envelope after the digital input signal has terminated. The counter IC is incremented by the system clock of 20 MHz which produces a minimum clock period output of 50 ns depending on preset value selected from S2 wafers 2 through 5. The TTL signal present at the output of U1 pin 7 enables the counter U5 to begin counting up. The complement of the TTL signal derived from U1 pin 6 clocks the latch circuit of U6. Only after the counter circuit U5 has completed counting up and produces a carry out signal (U5 pin 15) does U6 latch become cleared. The pin 5 and 6 output of U6 also provides optional additional control for increased attenuation providing higher signal-to-noise ratio if desired. The counter U5 can be preset by a digital interface (not shown) with the same representation as switch S2, wafers 2-5. The digital presets provided by the switch S2, wafers 2-5 or an equivalent digital interface with respect to the controlled pulse fall times are as follows:

| SW POS | T ns | D | C | B | A |
|---|---|---|---|---|---|
| 1 | 50 | 1 | 1 | 0 | 1 |
| 2 | 100 | 1 | 1 | 0 | 0 |
| 3 | 150 | 1 | 0 | 1 | 1 |
| 4 | 200 | 1 | 0 | 1 | 0 |
| 5 | 250 | 1 | 0 | 0 | 1 |
| 6 | 300 | 1 | 0 | 0 | 0 |
| 7 | 350 | 0 | 1 | 1 | 1 |
| 8 | 400 | 0 | 1 | 1 | 0 |
| 9 | 450 | 0 | 1 | 0 | 1 |
| 10 | 500 | 0 | 1 | 0 | 0 |
| 11 | 550 | 0 | 0 | 1 | 1 |
| 12 | 600 | 0 | 0 | 1 | 0 |

The TTL signal at pin 7 of U1 is also coupled to integrated circuit U6, wherefrom trigger signals, synchronized with the clock pulses, are coupled to the integrated circuit U4. In response to these trigger pulses, integrated circuit U4 provides the switching control signals synchronized to the 20 MHz clock pulses.

The integrated circuit U4 comprises internal drivers which are paralleled to provide greater current sink and source capability, while maintaining fast rise and fall times with minimum delay. All digital integrated circuits selected utilize fast TTL gates to provide high speed operation and reasonable drive current capabilities. R1 and R4 are hard pull ups on the outputs of the drivers U4 to guarantee a +5 V signal. R5 and R2 determine the base current for Q2 and Q1, respectively. The values of these resistors are chosen to satisfy the base current requirement of each of the transistors Q2 and Q1 when the rise and fall time control is set to the fastest position which requires maximum collector current. The fastest position in the present embodiment is 50 nanoseconds.

VR1 and VR2 are selected to generate a predetermined voltage drop across C12 and C9, respectively, and to force C9 and C12 to discharge through the circuit path of R4, R5 and R1, R2, respectively. Diodes CR1 and CR2 clamp the emitters of Q1 and Q2, respectively, to one diode drop above the bases thereof. This prevents base-emitter breakdown thus protecting the transistors Q1 and Q2 from internal damage and failure. The transistors Q1 and Q2 are selected for the high Beta and switching speed characteristics thereof. The resistors R3 and R6 assist in maintaining Q1 and Q2 turned off in the event of excessive leakage currents which may turn the transistors back on. CR3 provides a low impedance path when forward-biased, to assist in the removal of stored charge from the base of Q3. R8 determines the reverse-bias current for Q3 and R7 determines the base current of Q3. Diode CR4 clamps the base voltage of Q3 one diode drop below the emitter voltage for a very fast turn off time.

Wafer 1 of both switches S1 and S2 switch in appropriate resistance values to charge and discharge the capacitor C27 in twelve steps of 50 nanoseconds each. The resistors R30 through R53 provide the precise charge and discharge currents for the common capacitor C27. The following chart lists the resistors utilized to achieve the rise and fall times for the value of C27 illustrated.

| SW2 POS | RISE | | FALL | |
|---|---|---|---|---|
| | R | OHMS | R | OHMS |
| 1 | 30 | 200 | 42 | 442 |
| 2 | 31 | 604 | 43 | 909 |
| 3 | 32 | 1000 | 44 | 1240 |
| 4 | 33 | 1330 | 45 | 1620 |
| 5 | 34 | 1620 | 46 | 1820 |
| 6 | 35 | 2000 | 47 | 2000 |
| 7 | 36 | 2260 | 48 | 2260 |
| 8 | 37 | 2670 | 49 | 2670 |
| 9 | 38 | 3010 | 50 | 3010 |
| 10 | 39 | 3320 | 51 | 3320 |
| 11 | 40 | 3650 | 52 | 3650 |
| 12 | 41 | 3920 | 53 | 3920 |

Providing the high quality variable capacitor C27 permits calibration of all of the steps controlling the RF envelope rise and fall times.

FIG. 6B illustrates the drive circuitry utilized to control the bias of the RF PIN diode. Q4 and Q6 are three terminal regulators which provide the positive and negative clamp voltages from which the capacitor C27 is charged and discharged. Q4 is a precision voltage regulator with variable adjustment provided by the R14, R15 combination which determines the positive clamp voltage to which the capacitor C27 will charge. Diode CR5 permits capacitor C27 to discharge below the positive clamp voltage. C18, C25 and C26 provide filtering of AC noise. R16 is a constant load to maintain the regulator Q4 operating in the current source mode. Operating in the current source mode provides switching response advantages of clamp circuits. In a similar manner, Q6 and the circuitry associated therewith provides the negative clamp voltage for C27.

U9 is a very high speed, high input impedance buffer providing switching isolation. R24 is an isolation resistor separating the effects of the charge/discharge circuitry from the current amplifier U9.

U10 is a high speed operational amplifier with an adjustable AC gain of less than unity and with an offset adjustable via Q5. Thus, U10 and the components associated therewith are configured as an inverting high slew rate operational amplifier with adjustable AC gain in the region of 1/10 to 1/30 via trim potentiometer R23. C46 and C49 provide frequency compensation for maximum speed and stability. After the appropriate AC parameters have been determined, adjustment of the DC component properly positions the attenuation region of the PIN diode. The DC adjustment is achieved by utilizing Q5 as a variable precision positive voltage regulator. Q5 and the circuitry associated therewith are similar to Q4 with its associated circuitry. R25 is utilized in a manner similar to that described with respect to R24 as an isolation resistor for preventing the effects of current switching to be coupled to the following stage.

U8 is a high speed, high input impedance, very low output impedance buffer which sources and sinks current for the RF PIN diode utilized. Thus, U8 is configured to provide high currents during the envelope rise and fall times via R26/C40 and R27/C42. By storing energy in C40 and C42, a low AC source impedance is maintained which provides maximum control speeds of the PIN diode being modulated. This is a very important feature because of the characteristics of PIN diodes. CR11 provides a protection clamp for reverse voltages.

FIG. 6B also includes filter 38 for filtering the ±5 and ±15 volt supplies utilized throughout the circuitry of FIGS. 6A and 6B.

The above-described embodiment of the invention provides a variable rise/fall time RF modulator providing complete and accurate control over all parameters associated with RF PIN diodes to achieve controlled attenuation as well as fast switching times. The present invention not only provides rise/fall time control for the RF PIN diode attenuator, but also provides appropriate source termination therefor. The invention provides the very precise current control capabilities and extremely fast response times required for accurate and reliable RF attenuation utilizing PIN diodes. The invention provides precise control of the RF envelope rise and fall time for reliable envelope shaping. The circuitry of the present invention provides for complete control of the modulated pulse accomplished through accurate linear control of the foward and reverse-bias regions of the PIN diode. The adjustability of the rise and fall transition times of the modulated pulse enables complete control over the shape or envelope of the modulated pulse. This control also eliminates the transients that in the prior art were generated by uncontrolled modulation techniques. The invention provides exact means to precisely modulate a radio frequency signal. The control enables the adjustment of the bandwidth of the modulated pulse via the variable pulse rise and fall times. In addition, the transients normally associated with pulse transitions are eliminated. The circuitry described above provides for linear attenuation control of a typical PIN diode during the pulse transition times.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. An apparatus for providing pulse control signals to a PIN diode attenuator in a manner to provide controllable rise and fall times for a pulsed output signal from the PIN diode comprising:
   means for providing first and second predetermined voltages;
   means for switching from said first predetermined voltage to said second predetermined voltage and for switching from said second predetermined voltage to said first predetermined voltage to provide a pulse control signal having said rise and fall times, said switching from said first predetermined voltage to said second predetermined voltage providing said rise time and said switching from said second predetermined voltage to said first predetermined voltage providing said fall time,;
   isolation buffer means coupled to said switching means for providing buffered pulse control signals;
   controlling means having a DC offset level which determines a region of said PIN diode attenuation characteristics over which attenuation is controlled and responsive to said buffered pulse control signals to provide further pulse control signals; and
   means responsive to said further pulse control signals for providing said pulse control signals to said PIN diode attenuator.

2. The apparatus of claim 1 wherein said swithing means includes:
   first and second voltage sources respectively providing said first and second predetermined voltages;
   a capacitor coupled to said first and second voltage sources; and
   voltage switching means coupled to said capacitor and said first and second voltage sources for providing a first transition from said first predetermined voltage to said second predetermined voltage and a second transition from said second predetermined voltage to said first predetermined voltage, said first transition controlling said rise time and said second transition controlling said fall time.

3. An apparatus in accordance with claim 2 wherein said voltage switching means includes:
   first and second adjustable resistors coupled to said capacitor; and
   means coupled to said first and second adjustable resistors to provide a charging circuit for said capacitor through said first adjustable resistor during said first transition so that said first adjustable resistor determines said rise time and to provide a discharging circuit through second adjustable resistor during said second transition so that said second adjustable resistor determines said fall time.

4. An apparatus in accordance with claim 3 wherein said first predetermined voltage is provided by a first regulated source via a first clamping diode coupled between said capacitor and said first regulated source and said second predetermined voltage is provided by a second regulated voltage source via a second clamping diode coupled between said capacitor and said second voltage source.

5. An apparatus in accordance with claim 1 wherein said controlling means comprises:

means for inverting said buffered pulse control signal to provide said further pulse control signal.

6. An apparatus in accordance with claim 5 wherein said controlling means include a regulated voltage source coupled to said inverting means and an adjustment control coupled to said regulated voltage source for adjusting said DC offset level.

7. An apparatus in accordance with claim 1 wherein said means for providing said attenuation control signals includes a high speed, high input impedance, low output impedance operational amplifier with capacitors coupled to said operational amplifier for storing energy during said rise times and said fall times so as to maintain a low AC source impedance to said PIN diode attenuator.

* * * * *